United States Patent
Trottier-Lapointe

(10) Patent No.: US 12,210,136 B2
(45) Date of Patent: Jan. 28, 2025

(54) ARTICLE COATED WITH AN ANTIREFLECTIVE COATING HAVING IMPROVED OPTICAL PROPERTIES

(71) Applicant: ESSILOR INTERNATIONAL, Charenton-le-pont (FR)

(72) Inventor: William Trottier-Lapointe, Charenton-le-pont (FR)

(73) Assignee: Essilor International, Charenton-le-Pont (FR)

( * ) Notice: Subject to any disclaimer, the term of this patent is extended or adjusted under 35 U.S.C. 154(b) by 718 days.

(21) Appl. No.: 17/428,409

(22) PCT Filed: Feb. 4, 2020

(86) PCT No.: PCT/EP2020/052765
§ 371 (c)(1),
(2) Date: Aug. 4, 2021

(87) PCT Pub. No.: WO2020/161141
PCT Pub. Date: Aug. 13, 2020

(65) Prior Publication Data
US 2022/0107444 A1    Apr. 7, 2022

(30) Foreign Application Priority Data
Feb. 5, 2019    (EP) .................................. 19305138

(51) Int. Cl.
| | | |
|---|---|---|
| G02C 7/02 | (2006.01) | |
| C23C 14/08 | (2006.01) | |
| C23C 14/10 | (2006.01) | |
| C23C 28/04 | (2006.01) | |
| G02B 1/111 | (2015.01) | |
| G02C 3/00 | (2006.01) | |
| G02C 7/10 | (2006.01) | |

(52) U.S. Cl.
CPC ............ *G02B 1/111* (2013.01); *C23C 14/083* (2013.01); *C23C 14/086* (2013.01); *C23C 14/10* (2013.01); *C23C 28/042* (2013.01); *G02C 7/10* (2013.01)

(58) Field of Classification Search
CPC ..... C23C 14/083; C23C 14/086; C23C 14/10; C23C 28/042; G02B 1/111; G02B 1/115; G02B 1/116; G02B 1/11; G02B 1/12; G02B 1/14; G02B 1/16; G02B 1/18; G02B 1/113; G02B 5/283; G02B 5/208; G02B 5/282; G02B 5/3066; G02C 7/10; G02C 7/022; G02C 7/02; G02C 7/107; G02C 7/104; G02C 2202/16
USPC ........................... 351/159.6–159.65; 359/603
See application file for complete search history.

(56) References Cited

U.S. PATENT DOCUMENTS

| | | |
|---|---|---|
| 5,508,368 A | 4/1996 | Knapp et al. |
| 2002/0001725 A1 | 1/2002 | Ichimura |
| 2004/0157061 A1 | 8/2004 | Ichimura |
| 2006/0023311 A1 | 2/2006 | Scherer et al. |
| 2006/0257557 A1 | 11/2006 | Scherer et al. |
| 2008/0206470 A1 | 8/2008 | Thomas et al. |
| 2013/0155373 A1 | 6/2013 | Cado et al. |
| 2016/0154254 A1 | 6/2016 | Bolshakov et al. |
| 2017/0235020 A1 | 8/2017 | Bolshakov |
| 2017/0299887 A1 | 10/2017 | Maury et al. |
| 2018/0372916 A1 | 12/2018 | Chiarotto et al. |
| 2019/0154882 A1* | 5/2019 | Byun ..................... G02B 1/116 |
| 2019/0225536 A1 | 7/2019 | Trottier-Lapointe et al. |

FOREIGN PATENT DOCUMENTS

| | | |
|---|---|---|
| EP | 0614957 A1 | 9/1994 |
| EP | 1 123 905 | 8/2001 |
| EP | 2988153 A1 | 2/2016 |
| EP | 3390682 B1 | 10/2019 |
| JP | 5-323103 | 12/1993 |
| JP | 2016-138938 | 8/2016 |
| WO | 2008/015364 A1 | 2/2008 |
| WO | 2008/062142 A1 | 5/2008 |
| WO | 2009/047426 A2 | 4/2009 |
| WO | 2010/109154 A1 | 9/2010 |
| WO | 2011/080472 A2 | 7/2011 |
| WO | 2012/076714 A1 | 6/2012 |
| WO | 2013/098531 | 7/2013 |
| WO | 2018/192998 A1 | 10/2018 |

OTHER PUBLICATIONS

International Search Report for PCT/EP2020/052765, mailed Apr. 3, 2020, 4 pages.
Written Opinion of the ISA for PCT/EP2020/052765, mailed Apr. 3, 2020, 6 pages.

* cited by examiner

*Primary Examiner* — Mahidere S Sahle
(74) *Attorney, Agent, or Firm* — NIXON & VANDERHYE

(57) ABSTRACT

Disclosed is an optical article including a substrate having a front main face and a rear main face, the rear main face being coated with a multilayer antireflection coating. The outermost layer of the multilayer antireflection coating is a layer A containing silicon, carbon and fluorine atoms, the layer A having a refractive index lower than or equal to 1.45 and a thickness higher than or equal to 20 nm. The mean light reflection factor Rv on the rear main face between 380 nm and 780 nm is lower than or equal to 1.5%. The mean reflection factor Ruv on the rear main face between 280 nm and 380 nm, weighted by the function W (2) defined in the ISO 13666:1998 standard, is lower than or equal to 7%, for an angle of incidence of 35°.

20 Claims, No Drawings

ARTICLE COATED WITH AN ANTIREFLECTIVE COATING HAVING IMPROVED OPTICAL PROPERTIES

This application is the U.S. national phase of International Application No. PCT/EP2020/052765 filed 4 Feb. 2020, which designated the U.S. and claims priority to EP patent application Ser. No. 19/305,138.0 filed 5 Feb. 2019, the entire contents of each of which are hereby incorporated by reference.

FIELD OF THE INVENTION

The present invention relates to an optical article comprising an antireflective coating which strongly reduces reflection in the visible region and in the UV region whose optical properties are improved over the prior art, either with respect to the visible and or UV reflection that can still be lowered, or in terms of additional optical properties and/or robustness.

The optical article may especially be an ophthalmic lens, especially a spectacle lens.

DESCRIPTION OF RELATED ART

An antireflection coating usually consists of a multilayer stack comprising interferential thin layers, generally an alternation of layers based on a dielectric material of high refractive index and a dielectric material of low refractive index. When deposited on a transparent substrate, the function of such a coating is to reduce its light reflection and therefore to increase its light transmission. A substrate thus coated will therefore have its transmitted light/reflected light ratio increased, thereby improving the visibility of objects placed behind it. When it is sought to achieve a maximum antireflection effect, it is then preferable to provide both faces (front and rear faces) of the substrate with this type of coating.

This antireflective coating is usually used in the ophthalmic field. Accordingly, traditional antireflective coatings are designed and optimized to reduce reflection on the lens surface in the visible region, typically within the spectrum range of from 380 to 780 nm. In general, the mean light reflection factor in the visible region $R_v$ on the front and/or rear faces of an ophthalmic lens is lower than 2.5% per face.

The UV radiation coming from the front face of the lens is generally blocked by the lens substrate.

The UV radiation resulting from light sources located behind the wearer may reflect on the lens rear face and reach the wearer's eye if the lens is not provided with an antireflective coating which is efficient in the ultraviolet region.

It is admitted that the light rays that may reflect onto the lens rear face and reach the wearer's eye have a narrow incidence angle range, ranging from 30° to 45° (oblique incidence). The most recent antireflective coatings situated on the rear main face of ophthalmic lenses are designed and optimized to reduce reflection on the lens surface, not only in the visible range, but also within the UVA band of from 315 to 400 nm and/or the UVB band of from 280 to 315 nm. These UVA and UVB bands are indeed particularly harmful to the retina.

The application WO 2012/076714 in the name of the applicant describes an ophthalmic lens with very low reflectance values in the visible region, capable of reducing the UV radiation reflection. This ophthalmic lens comprises a substrate with a front main face and a rear main face, the rear main face being coated with a multilayered antireflective coating comprising a stack of at least one layer having a refractive index higher than 1.6 and at least one layer having a refractive index lower than 1.5. The ophthalmic lens is characterized in that:

the mean reflection factor on said rear face in the visible region $R_m$ is lower than or equal to 1.15%, the mean light reflection factor on said rear face in the visible region $R_v$ is lower than or equal to 1%, the mean reflection factor Ruv on said rear face between 280 nm and 380 nm, weighted by the function $W(\lambda)$ defined in the ISO 13666:1998 standard, is lower than 5%, for an angle of incidence of 30° and for an angle of incidence of 45°, the multilayered antireflective coating comprises a number of layers higher than or equal to 3 and lower than or equal to 7, preferably lower than or equal to 6, more preferably lower than or equal to 5, the multilayered antireflective coating does not comprise any electrically conductive layer with a thickness higher than or equal to 20 nm based on indium oxide, and the antireflective coating outer layer is a silica-based layer.

As the UV radiation coming from the front face of the lens is generally blocked by the lens substrate, the dangerous UV light is essentially due to the back reflection on the rear face so there is wish to decrease as much as possible the Ruv value on this rear face.

It is also of first importance to be very reproducible in the Ruv values from batch to batch to ensure that each product lens will provide the required degree of UV protection.

However, optimizing the antireflective performances over the whole ultraviolet region reveals generally detrimental to the antireflective performances in the visible region. Conversely, optimizing only the antireflective performances in the visible region does not make sure that satisfactory antireflective properties can be obtained in the ultraviolet region Moreover, the trend is to add additional optical properties to the AR layer such as blue light blocking properties or infrared blocking properties. Consequently, there are more and more optical requirements that antireflective stacks have to fulfill.

Also, it may be of interest to provide a lens with a low chroma value (in reflection), so that the lens is seen as "achromatic", that is to say that the lens is perceived without any reflected color, compared to most of current lenses for which the reflected light has a green or blue color.

However, it is known that the lower the chroma value the more difficult it is to keep robustness of this value.

The antireflective coatings described in this application are very efficient in the visible region ($R_v$ is lower than or equal to 1%), while being at the same time capable of significantly reducing the UVA radiation reflection, especially ultraviolet A- and ultraviolet B-rays.

The term "robustness" of a lens in the present invention is defined as the ability of this lens to resist change despite the variations induced by its manufacture process. These variations depend, for instance, on the type of substrate which is used, the setting of the manufacturing machine (temperature schedule, appropriate time, setting of the electron gun . . . ) and/or its usage mode, the replacement of said manufacturing machine by another one.

Indeed, when multilayered antireflective coating is manufactured at industrial scale, some thickness variations for each layer generally occur. These variations lead to different reflection performance, and especially different perceived residual reflected color of the multilayered antireflective coating. If the perceived residual reflected color of the antireflective coating of two lenses is different, these lenses will appear different and will not be able to be associated in pair.

EP 2988153 relates to an ophthalmic lens with a low reflection both in the ultraviolet region and in the visible region, comprising a substrate with a front main face and a rear main face, said rear main face being coated with a multilayered antireflective coating comprising a stack of at least one layer having a refractive index higher than 1.6 and of at least one layer having a refractive index lower than 1.55, wherein:
the mean reflection factor Ruv on said rear face between 280 nm and 380 nm, weighted by the function $W(\lambda)$, is lower than or equal to 5%, preferably is lower than or equal to 4%, for an angle of incidence of 35°,
the Chroma C* is equal or lower than 4, preferably lower or equal to 3, for an angle of incidence ($\theta$) of 15°.

It is an aim of this invention to provide antireflective stacks having decreased Rv and Ruv compared to the prior art, and having good robustness.

It is another aim of this invention to provide antireflective stack having a low chroma value.

It is also an aim of the invention to solve one or more of the technical problem above without increasing or without increasing too much the number of layers and/or the thickness of the antireflective stack, and preferably while keeping or improving mechanical properties of the stack.

In a general manner, there is still a need to provide novel antireflective coatings having very good antireflective properties at least in the visible region and possibly in the UVA and UVB bands, while having at the same time robustness properties and aesthetic appearance whatever the angle of incidence versus the antireflective coatings of the prior art.

SUMMARY OF THE INVENTION

The invention relates to an optical article comprising a substrate having a front main face and a rear main face, the rear main face being coated with a multilayer antireflection coating, wherein the outermost layer of said multilayer antireflection coating is a layer A containing silicon, carbon and fluorine atoms, said layer A having a refractive index lower than or equal to 1.45 and a thickness higher than or equal to 20 nm, and
the mean light reflection factor Rv on said rear main face between 380 nm and 780 nm is lower than or equal to 1.5%,
the mean reflection factor Ruv on said rear main face between 280 nm and 380 nm, weighted by the function $W(\lambda)$ defined in the ISO 13666:1998 standard, is lower than or equal to 7%, for an angle of incidence of 35°.

According to an embodiment, layer A has a refractive index ranging from 1.40 to 1.45, preferably from 1.42 to 1.45, more preferably from 1.43 to 1.45.

The inventor has found that the improvement in optical properties and the improvement of robustness can be obtained by a slight decrease of the refractive index of the outermost layer of the multilayer antireflection coating.

In an embodiment, the multilayer antireflection coating has a chroma C* (in reflection) as defined in the international colorimetric system CIE L*a*b* lower than or equal to 3, preferably lower than or equal to 2, for an angle of incidence of 15°.

In another embodiment, said multilayer antireflection coating has a chroma C* whose standard deviation (defined in the experimental part) is lower than 1.4, preferably lower than 1.3.

In another embodiment, the multilayer antireflection coating has a hue angle h ranging from 255° to 285°.

In another embodiment, the multilayer antireflection coating has a hue angle h ranging from 120° to 175°.

In another embodiment, layer A has a thickness ranging from 20 to 150 nm and preferably from 25 to 120 nm.

Detailed Description of the Invention and Preferred Embodiments

The invention relates to an optical article comprising a substrate having a front main face and a rear main face, the rear main face being coated with a multilayer antireflection coating, wherein the outermost layer of said multilayer antireflection coating is a layer A containing in its structure silicon, carbon and fluorine atoms, said layer A having a refractive index lower than or equal to 1.45 and a thickness higher than or equal to 20 nm, and
the mean light reflection factor Rv on said rear main face between 380 nm and 780 nm is lower than or equal to 1.5%,
the mean reflection factor Ruv on said rear main face between 280 nm and 380 nm, weighted by the function W (2) defined in the ISO 13666:1998 standard, is lower than or equal to 7%, for an angle of incidence of 35°.

Layer A optionally contains in its structure oxygen and/or nitrogen.

In an embodiment, the multilayer antireflection coating has a chroma C* (in reflection) as defined in the international colorimetric system CIE L*a*b* lower than or equal to 3, preferably lower than or equal to one of the following values, for an angle of incidence of 15°: 2.5, 2, 1.5; 1.4, 1.3, 1.2, 1.0, 1.1, 0.9.

According to the invention, the "angle of incidence (symbol θ)" is the angle formed by a ray light incident on an ophthalmic lens surface and a normal to the surface at the point of incidence. The ray light is for instance an illuminant light source, such as the standard illuminant D65 as defined in the international colorimetric CIE L*a*b*. Generally the angle of incidence changes from 0° (normal incidence) to 90° (grazing incidence). The usual range for angle of incidence is from 0° to 75°.

The colorimetric coefficients of the optical article of the invention in the international colorimetric system CIE L*a*b* are calculated between 280 and 780 nm, taking the standard illuminant D 65 and the observer into account (angle of) 10°. It is possible to prepare antireflective coatings, without limitation as regards their hue angle. The observer is a "standard observer" as defined in the international colorimetric system CIE L*a*b*.

It has been surprisingly found that the ophthalmic lens according to the invention presents good robustness properties.

This means that small variations in antireflective coating thicknesses, due to process variations or due to ophthalmic lens curvature, lead to non visible differences for observers. In other words, lenses produced in different batches or with different equipment will have matched colours for observers and may be associated in pairs, In an embodiment, on a single ophthalmic lens, Chroma C* measured on two separated points of the lens, for instance in the center and on the periphery of the lens, will not differ by more than 1.4, preferably will not differ by more than one from the following values 1.3, 1.2, 1.1. Besides, the antireflective coating according to the invention is especially designed to possess very good antireflective performances in the visible regions and/or to minimize the reflection towards the eye of the ultraviolet radiation having an angle of incidence on the lenses especially ranging from 30 to 45°, and its preferred characteristics are described hereunder.

In the present application, the mean reflection factor between 280 nm and 380 nm, weighted by the W(λ) function defined according to the ISO 13666:1998 standard and noted Ruv, may be defined through the following relation:

$$R_{UV} = \frac{\int_{280}^{380} W(\lambda) \cdot R(\lambda) \cdot d\lambda}{\int_{280}^{380} W(\lambda) \cdot d\lambda}$$

wherein R(λ) represents the lens spectral reflection factor at a given wavelength, and W(λ) represents a weighting function equal to the product of the solar spectrum irradiance Es(λ) and the efficiency relative spectral function S(λ).

The spectral function W(λ), enabling to calculate the ultraviolet radiation transmission factors, is defined according to the ISO 13666:1998 Standard. It makes it possible to express the ultraviolet solar radiation distribution tempered by the relative spectral efficiency of such radiation for the wearer, since it simultaneously takes both the solar spectral energy Es(λ) into account, which does globally emit less UVB-rays as compared to UVA-rays, and the spectral efficiency S(λ), UVB-rays being more harmful than UVA-rays. The values for those three functions in the ultraviolet region are given in the following table 1:

TABLE 1

| Wavelength λ (nm) | Solar spectrum irradiance Es(λ) (mW/m² · nm) | Efficiency relative spectral function S(λ) | Weighting function W(λ) = Es(λ) · S(λ) |
|---|---|---|---|
| 280 | 0 | 0.88 | 0 |
| 285 | 0 | 0.77 | 0 |
| 290 | 0 | 0.64 | 0 |
| 295 | $2.09 \times 10^{-4}$ | 0.54 | 0.00011 |
| 300 | $8.10 \times 10^{-2}$ | 0.30 | 0.0243 |
| 305 | 1.91 | 0.060 | 0.115 |
| 310 | 11.0 | 0.015 | 0.165 |
| 315 | 30.0 | 0.003 | 0.09 |
| 320 | 54.0 | 0.0010 | 0.054 |
| 325 | 79.2 | 0.00050 | 0.04 |
| 330 | 101 | 0.00041 | 0.041 |
| 335 | 128 | 0.00034 | 0.044 |
| 340 | 151 | 0.00028 | 0.042 |
| 345 | 170 | 0.00024 | -0.041 |
| 350 | 188 | 0.00020 | 0.038 |
| 355 | 210 | 0.00016 | 0.034 |
| 360 | 233 | 0.00013 | 0.03 |
| 365 | 253 | 0.00011 | 0.028 |
| 370 | 279 | 0.000093 | 0.026 |
| 375 | 306 | 0.000077 | 0.024 |
| 380 | 336 | 0.000064 | 0.022 |

It should be noted that the weighting function W(λ) is nil or almost nil between 280 nm and 295 nm, which means that the weighted mean reflection factor is also nil within this wavelength range. This means that even if the reflection level is high over this spectral range, there will be no consequence on the weighted mean reflection factor value Ruv calculated between 280 and 380 nm.

According to the invention, the mean reflection factor on said rear face in the visible region $R_m$ is lower than or equal to 3%, preferably lower than or equal to 2.5%, for an angle of incidence lower than or equal to 35°, typically at 15°.

In the present application, the "mean reflection factor," noted $R_m$, is such as defined in the ISO 13666:1998 standard, and measured in accordance with the ISO 8980-4 Standard (for an angle of incidence lower than 17°, typically of) 15°, i.e. this is the (non weighted) spectral reflection average over the whole visible spectrum between 400 and 700 nm.

In particular, the mean light reflection factor on said rear face in the visible region $R_v$ is lower than or equal to 1.5%, preferably lower than or equal to 1.2%, and more preferably lower than at least one of the following values, 1.1, 1.0, 0.9, 0.8, 0.7, 0.6, 0.5 for an angle of incidence of 15°.

The "mean light reflection factor," noted Rv, is such as defined in the ISO 13666:1998 standard, and measured in accordance with the ISO 8980-4, i.e. this is the weighted spectral reflection average over the whole visible spectrum between 380 and 780 nm. $R_v$ is usually measured for an angle of incidence lower than 17°, typically of 15°, but can be evaluated for any angle of incidence.

According to the present invention, the antireflective coating deposited onto the rear face of the substrate is such that:
the mean reflection factor Ruv on said rear face between 280 nm and 380 nm, weighted by the function W (2) defined according to the ISO 13666:1998 standard, is lower than or equal to 7%, for an angle of incidence of 35°. It is preferably lower than or equal to one of the following values: 6%, 5%, 4.5%, 4%, 3.5%, 3%, 2.8%, 2.7%, 2.6%, 2.5% for an angle of incidence of 35°.
the mean light reflection factor on said rear face in the visible region $R_v$ of the optical article is lower than or equal to 1.5%, preferably ≤1.2%, more preferably ≤1.0%, especially ≤0.85% for an angle of incidence of 15°;

Preferred combined ranges of optical properties are:
Ruv<3% (more preferably Ruv<2.8% or less); Rv≤1.2%, 1%, or 0.8%. C* is lower than any one of the following values: 1.8, 1.7, 1.6, 1.5, 1.4, 1.3; and preferably standard deviation on chroma C* is <1.4, preferably <1.3.

The person skilled in the art is capable of choosing suitable materials and thicknesses for the various layers of the antireflective coating so as to have the different desired parameters Rv and Ruv.

In the present application, when an article has one or more coatings on its surface, the expression "to deposit a layer or a coating on the article" is understood to mean that a layer or a coating is deposited on the uncovered (exposed) surface of the external coating of the article, i.e. its coating furthest from the substrate.

A coating that is "on" a substrate or that has been deposited "on" a substrate is defined as a coating that (i) is positioned above the substrate, (ii) does not necessarily make contact with the substrate (although preferably it does), i.e. one or more intermediate coatings may be arranged between the substrate and the coating in question, and (iii) does not necessarily completely cover the substrate (although preferably it will do). When "a layer 1 is located under a layer 2", it will be understood that the layer 2 is further from the substrate than the layer 1.

The article produced according to the invention comprises a substrate, preferably a transparent substrate, having a rear main face comprising a layer A.

The "rear face" of the substrate (the rear face is generally concave) is understood to be the face that, when the article is being used, is closest to the eye of the wearer. Conversely, the "front face" of the substrate (the front face is generally convex) is understood to be the face that, when the article is being used, is furthest from the eye of the wearer.

Although the article according to the invention may be any type of article, such as a screen, a glazing unit, a pair of protective glasses that may especially be used in a working environment, a mirror, or an article used in electronics (e.g., OLED), it is preferably an optical article, more preferably an optical lens, and even more preferably an ophthalmic lens for a pair of spectacles, or a blank optical or ophthalmic lens such as a semi-finished optical lens, and in particular a spectacle glass. The lens may be a polarized or tinted lens or a photochromic lens. Preferably, the ophthalmic lens according to the invention has a high transmission.

The substrate of the article according to the invention is preferably an organic eyeglass, for example made of thermoplastic or thermosetting plastic. This substrate may be chosen from the substrates mentioned in patent application WO 2008/062142, and may for example be a substrate obtained by (co) polymerization of diethyleneglycol bis-allylcarbonate, a poly(thio) urethane substrate or a substrate made of (thermoplastic) bis-phenol-A polycarbonate (PC).

Before the layer A is deposited on the substrate, which is optionally coated, for example with an anti-abrasion and/or anti-scratch coating, it is common to subject the surface of said optionally coated substrate to a physical or chemical activation treatment intended to increase the adhesion of the layer A. This pretreatment is generally carried out under vacuum. It may be a question of a bombardment with energetic and/or reactive species, for example an ion beam (ion pre-cleaning or IPC) or an electron beam, a corona discharge treatment, a glow discharge treatment, a UV treatment or treatment in a vacuum plasma, generally an oxygen or argon plasma. It may also be a question of an acidic or basic surface treatment and/or a treatment with solvents (water or organic solvent(s)). Several of these treatments may be combined. By virtue of these cleaning treatments, the cleanliness and the reactivity of the surface of the substrate are optimized.

The term "energetic species" (and/or "reactive species") is particularly understood to mean ionic species having an energy ranging from 1 to 300 eV, preferably from 1 to 150 eV, better still from 10 to 150 eV and even better still from 40 to 150 eV. The energetic species may be chemical species, such as ions, radicals, or species such as photons or electrons.

The preferred pre-treatment of the surface of the substrate is an ion bombardment treatment carried out by means of an ion gun, the ions being particles formed from gas atoms from which one or more electrons have been stripped. Argon is preferably used as the gas ionized ($Ar^+$ ions), though oxygen or a mixture of oxygen and argon may also be used, under an acceleration voltage generally ranging from 50 to 200 V, a current density generally contained between 10 and 100 µA/cm² at the activated surface, and generally under a residual pressure in the vacuum chamber possibly ranging from $8 \times 10^{-5}$ mbar to $2 \times 10^{-4}$ mbar.

The article according to the invention comprises a layer A that constitutes the outermost layer of a multilayer antireflection coating (i.e., the layer of the multilayer antireflection coating furthest from the substrate in the stacking order). Said multilayer antireflection coating is preferably formed on an anti-abrasion coating. Anti-abrasion coatings based on epoxysilane hydrolysates containing at least two and preferably at least three hydrolyzable groups, bonded to the silicon atom, are preferred. The hydrolyzable groups are preferably alkoxysilane groups.

The antireflection coating may be any antireflection coating conventionally used in the field of optics, in particular ophthalmic optics, provided that it contains a layer A as outermost layer which is preferably formed by depositing, under an ion beam, activated species issued from at least one organic compound C in gaseous form (preferably in external position). The multilayer antireflection coating may be an antireflective coating in the visible range optionally filtering ultra violet and/or blue light and/or infrared light.

In one embodiment, the multilayer antireflection coating comprises one layer A, preferably as an outermost layer. In another embodiment, the multilayer antireflection coating comprises at least two layers A, identical or different.

An antireflection coating is a coating, deposited on the surface of an article, which improves the antireflection properties of the final article. It reduces the reflection of light at the article/air interface over a relatively broad portion of the visible spectrum.

As is well known, these antireflection coatings conventionally contain a monolayer or multilayer stack of dielectric materials. These are preferably multilayer coatings, comprising layers with a high refractive index (HI) and layers with a low refractive index (LI).

In the present patent application, a layer of the multilayer antireflection coating is said to be a high refractive index layer when its refractive index is higher than 1.55, preferably higher than or equal to 1.6, more preferably higher than or equal to 1.8 and even more preferably higher than or equal to 2.0. A layer of a multilayer antireflection coating is said to be a low refractive index layer when its refractive index is lower than or equal to 1.55, preferably lower than or equal to 1.50 and more preferably lower than or equal to 1.45. Unless otherwise indicated, the refractive indices to which reference is made in the present invention are expressed at 25° C. for a wavelength of 550 nm.

The HI layers are conventional high refractive index layers, well known in the art. They generally contain one or more mineral oxides such as, nonlimitingly, zirconia ($ZrO_2$), titanium oxide ($TiO_2$), tantalum pentoxide ($Ta_2O_5$), neodymium oxide ($Nd_2O_5$), hafnium oxide ($HfO_2$), praseodymium oxide ($Pr_2O_3$), praseodymium titanate ($PrTiO_3$), $La_2O_3$, $Nb_2O_5$, $Y_2O_3$, indium oxide $In_2O_3$, or tin oxide $SnO_2$. Preferred materials are $TiO_2$, $Ta_2O_5$, $PrTiO_3$, $ZrO_2$, $SnO_2$, $In_2O_3$ and their mixtures.

The LI layers are also well known layers and may contain, nonlimitingly, $SiO_2$, $MgF_2$, $ZrF_4$, alumina ($Al_2O_3$) in a small proportion, $AlF_3$ and their mixtures, but are preferably $SiO_2$ layers. Layers made of SiOF (fluorine-doped $SiO_2$) may also be used.

Generally, the HI layers have a physical thickness ranging from 10 nm to 120 nm and the LI layers have a physical thickness ranging from 10 nm to 100 nm.

The total thickness of the multilayer antireflection coating is preferably smaller than 1 micron, more preferably smaller than or equal to 800 nm and even more preferably smaller than or equal to 500 nm. The total thickness of the multilayer antireflection coating is generally larger than 100 nm, and preferably larger than 150 nm.

Even more preferably, the multilayer antireflection coating contains at least two low refractive index (LI) layers and at least two high refractive index (HI) layers. The total number of layers in the multilayer antireflection coating is preferably smaller than or equal to 8 and more preferably smaller than or equal to 6.

The HI and LI layers need not be alternated in the multilayer antireflection coating though they may be in one embodiment of the invention. Two (or more) HI layers may be deposited on each other just as two (or more) LI layers may be deposited on each other.

Preferably, all the low refractive index layers of the multilayer antireflection coating according to the invention except for the layer A are inorganic in nature (i.e. the other low refractive index layers of the antireflection coating preferably do not contain any organic compounds).

Preferably, all the layers of the multilayer antireflection coating according to the invention except for the layer A are inorganic in nature, or in other words the layer A is preferably the only layer of organic nature in the multilayer antireflection coating of the invention (the other layers of the multilayer antireflection coating preferably containing no organic compounds).

According to one embodiment of the invention, the multilayer antireflection coating comprises a sub-layer. In this case, the sub-layer generally forms the first layer of this multilayer antireflection coating in the order of deposition of the layers, i.e. the sub-layer is the layer of the multilayer antireflection coating that makes contact with the underlying coating (which is generally an anti-abrasion and/or anti-scratch coating), or with the substrate when the multilayer antireflection coating is deposited directly on the substrate.

The expression "sub-layer of the multilayer antireflection coating" is understood to mean a coating of relatively large thickness used with the aim of improving the resistance of said coating to abrasion and/or scratches and/or to promote adhesion of the coating to the substrate or to the underlying coating. The sub-layer according to the invention may be chosen from the sub-layers described in patent application WO 2010/109154. Preferably, the sub-layer is between 100 to 600 nm, more preferably 100 to 500 nm in thickness. It is preferably exclusively mineral in nature and is preferably made of silica $SiO_2$.

In one embodiment, one or more so-called "impedance layers" (or adaptation layer also known as layers reducing the interference fringes) are interleaved between the sub-layer and the underlying coating (or the substrate), thus forming an impedance coating that limits interference fringes due to differences of refractive indices between the sub-layer and the underlying coating or substrate. The embodiment in which the multilayer antireflection coating comprises impedance layers is fully described in WO 2018/192998.

The article of the invention may be made antistatic by incorporating at least one electrically conductive layer into the multilayer antireflection coating. The term "antistatic" is understood to mean the property of not storing and/or building up an appreciable electrostatic charge. An article is generally considered to have acceptable antistatic properties when it does not attract and hold dust and small particles after one of its surfaces has been rubbed with an appropriate cloth.

The electrically conductive layer may be located in various places in the multilayer antireflection coating, provided that this does not interfere with the antireflection properties of the latter. It may for example be deposited on the sub-layer of the multilayer antireflection coating, if a sub-layer is present. It is preferably located between two dielectric layers of the multilayer antireflection coating, and/or under a low refractive index layer of the multilayer antireflection coating.

The electrically conductive layer must be sufficiently thin not to decrease the transparency of the multilayer antireflection coating. Generally, its thickness ranges from 0.1 to 150 nm and preferably from 0.1 to 50 nm depending on its nature. A thickness smaller than 0.1 nm generally does not allow sufficient electrical conductivity to be obtained, whereas a thickness larger than 150 nm generally does not allow the required transparency and low-absorption properties to be obtained.

The electrically conductive layer is preferably made from an electrically conductive and highly transparent material. In this case, its thickness preferably ranges from 0.1 to 30 nm, more preferably from 1 to 20 nm and even more preferably from 2 to 15 nm. The electrically conductive layer preferably contains a metal oxide chosen from indium oxide, tin oxide, zinc oxide and their mixtures. Indium tin oxide (tin-doped indium oxide, $In_2O_3$:Sn), indium oxide ($In_2O_3$), and tin oxide $SnO_2$ are preferred. According to one optimal embodiment, the electrically conductive and optically transparent layer is a layer of indium tin oxide (ITO).

Generally, the electrically conductive layer contributes to the antireflection properties obtained and forms a high refractive index layer in the multilayer antireflection coating. This is the case for layers made from an electrically conductive and highly transparent material such as layers of ITO.

The electrically conductive layer may also be a very thin layer of a noble metal (Ag, Au, Pt, etc.) typically smaller than 1 nm in thickness and preferably less than 0.5 nm in thickness.

The various layers of the multilayer antireflection coating (including the optional antistatic layer) other than the layer A are preferably deposited by vacuum deposition using one of the following techniques: i) evaporation, optionally ion-assisted evaporation, ii) ion-beam sputtering, iii) cathode sputtering or iv) plasma-enhanced chemical vapor deposition. These various techniques are described in the books "Thin Film Processes" and "Thin Film Processes II", edited by Vossen and Kern, Academic Press, 1978 and 1991, respectively. The vacuum evaporation technique is particularly recommended.

Preferably, each of the layers of the multilayer antireflection coating is deposited by vacuum evaporation.

Optionally, the deposition of one or more of the layers is performed by supplying (a supplementary) gas during the deposition step of the layer in a vacuum chamber, such as disclosed in US 2008/206470. Concretely, an additional gas such as a rare gas, for example argon, krypton, xenon, neon; a gas such as oxygen, nitrogen, or mixtures of two gases or more amongst these, is or are introduced into the vacuum deposition chamber while the layer is being deposited. The gas employed during this deposition step is not an ionized gas, more preferably not an activated gas.

This gas supply makes it possible to regulate the pressure and differs from an ionic bombardment treatment, such as ion assistance. It generally enables the limitation of stress in the interferential coating and to reinforce the adhesion of the layers. When such deposition method is used, which is called deposition under gas pressure regulation, it is preferred to work under an oxygen atmosphere (so called "passive oxygen"). The use of an additional gas supply during the deposition of a layer produces a layer that is structurally different from a layer deposited without additional gas supply.

The layer A is a low refractive index layer as defined according to the invention since it has a refractive index≤1.45. In some embodiments of the invention, the refractive index of the layer A is preferably lower than or equal to any one of the following values: 1.44 and 1.43.

In an embodiment, the layer A is made of a material M as described in EP3390682, which is obtained by vacuum deposition, by co-evaporating at least one metallic compound A chosen between alkaline earth metals and at least one organic compound B, the material M having a refractive index at a wavelength of 550 nm ranging from 1.38 to 1.47, wherein
 the organic compound B comprises an organosilicon compound or a mixture of organosiicon compounds,
 the deposition of organic compound B, under gaseous form, is implemented unde ionic assistance.

Other materials suitable for the A layer are those described in US2004157061 or EP1123905.

In an embodiment, the layer A is obtained by deposition of activated species originating from at least one compound C, in gaseous form, containing in its structure at least one Si—R group, where R is a fluoroalkyl group, at least one carbon atom, at least one hydrogen atom and optionally at least one nitrogen atom and/or at least one oxygen atom. The deposition of said layer A is carried out by applying a bombardment with an ion beam to layer A while layer A is being formed (ionic assistance, or "IAD"), and said layer A is preferably not formed from inorganic precursor compounds.

Preferably, the deposition is carried out in a vacuum chamber comprising an ion gun directed toward the substrates to be coated, which emits, toward said substrates, a beam of positive ions generated in a plasma within the ion gun. Preferably, the ions issued from the ion gun are particles formed from gas atoms from which one or more electrons have been stripped, the gas being a noble gas, oxygen or a mixture of two or more of these gases.

A precursor, the compound C, is introduced in a gaseous state into the vacuum chamber, preferably in the direction of the ion beam, and is activated under the effect of the ion gun.

Without wishing to be limited to any one theory, the inventors think that the plasma of the ion gun projects into a zone located a certain distance in front of the gun, without however reaching the substrates to be coated, and that activation/disassociation of the precursor compound C takes place preferentially in this zone, more generally near the ion gun, and to a lesser extent in the ion gun.

This deposition technique using an ion gun and a gaseous precursor, sometimes referred to as "ion beam deposition", is especially described in U.S. Pat. No. 5,508,368.

According to the invention, the ion gun is preferably the only place in the chamber where a plasma is generated.

The ion beam may, if required, be neutralized before it exits the ion gun. In this case, the bombardment is still considered to be ion bombardment as ions are still sent to the surface independently of the electrons. Generally, the ion bombardment causes atomic rearrangement in and a densification of the layer being deposited, tamping it down while it is being formed.

During the implementation of the process according to the invention, the surface to be treated is preferably bombarded by ions with a current density generally comprised between 20 and 1000 $\mu A/cm^2$, preferably between 30 and 500 $\mu A/cm^2$, more preferably between 30 and 200 $\mu A/cm^2$ at the activated surface and generally under a residual pressure in the vacuum chamber possibly ranging from $6\times10^{-5}$ mbar to $2\times10^{-4}$ mbar and preferably from $8\times10^{-5}$ mbar to $2\times10^{-4}$ mbar. An argon and/or oxygen ion beam is preferably used. When a mixture of argon and oxygen is used the $Ar:O_2$ molar ratio is preferably ≤1, more preferably ≤0.75 and even more preferably ≤0.5. This ratio may be controlled by adjusting the gas flow rates in the ion gun. The argon flow rate preferably ranges from 0 to 30 sccm. The oxygen $O_2$ flow rate preferably ranges from 5 to 30 sccm, and rises in proportion to the flow rate of the precursor compound of the layer A.

The ions of the ion beam, which are preferably issued from an ion gun used during the deposition of the layer A, preferably have an energy ranging from 75 to 150 eV, more preferably from 80 to 140 eV and even more preferably from 90 to 110 eV. The activated species formed are typically radicals or ions.

The technique of the invention differs from a deposition by means of a plasma (PECVD for example) in that it involves a bombardment, by means of an ion beam, of the layer A being formed, which beam is preferably emitted by an ion gun. Pressure ranges in PECVD are also typically much higher than in ion beam configuration, leading to different materials being deposited.

In addition to the ion bombardment during the deposition, it is possible to carry out a plasma treatment, optionally concomitant with the deposition under ion beam, of the layer A. The layer A is preferably deposited without the plasma assistance at the substrate level.

Said layer A is deposited in the presence of an oxygen source when the precursor compound C does not contain (or does not contain enough) oxygen atoms and it is desired for the layer A to contain a certain proportion of oxygen. Likewise, said layer A is deposited in the presence of a nitrogen source when the precursor compound C does not contain (or does not contain enough) nitrogen atoms and it is desired for the layer A to contain a certain proportion of nitrogen.

Apart from the layer A, other layers of the multilayer antireflection coating may be deposited under an ion beam. The evaporation of the precursor materials of the layer A, carried out under vacuum, may be achieved using a joule-effect heat source.

The precursor material of the layer A preferably comprises at least one compound C, containing in its structure at least one Si—R group, where R is a fluoroalkyl group, at least one carbon atom, at least one hydrogen atom and optionally at least one nitrogen atom and/or at least one oxygen atom. The compound C is an organosilicon compound and is considered as being organic in nature in the present application.

Preferably, the compound C contains at least one nitrogen atom and/or at least one oxygen atom and preferably at least one oxygen atom.

The concentration of each chemical element (Si, O, C, H, N) in the layer A may be determined using the Rutherford backscattering spectrometry technique (RBS), elastic recoil detection analysis (ERDA) or X-Ray photoelectron spectroscopy (XPS).

The atomic percentage of carbon atoms in the layer A is preferably lower than 40%, more preferably lower than 30%. It preferably ranges from 3 to 40%. The atomic percentage of silicon atoms in the layer A preferably ranges from 5 to 45% and more preferably from 10 to 30%. The atomic percentage of oxygen atoms in the layer A is preferably higher than 40%, more preferably higher than 50%. It preferably ranges from 35 to 70%, more preferably ranges from 40 to 65%. The atomic percentage of fluorine atoms in layer A preferably ranges from 0.5 to 8%, more preferably from 1.5 to 7%.

The O/Si atomic ratio in layer A preferably ranges from 1.8 to 3.5. The C/Si atomic ratio in layer A preferably ranges from 0.1 to 3. The Si/F atomic ratio in layer A preferably ranges from 3 to 30.

The fluoroalkyl group of compound C is linear or branched. It preferably comprises from 1 to 30 carbon atoms, better still from 1 to 10 or 1 to 5 and ideally from 1 to 3 carbon atoms. In one embodiment, this group is a perfluoroalkyl group.

The fluoroalkyl group of compound C is preferably a group of formula (I):

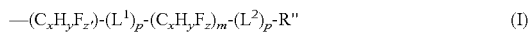

wherein R''' is a hydrogen or fluorine atom, an acyl group or an alkyl group which is linear or branched, which can be substituted with one or more heteroatoms or functional groups, and which can additionally comprise one or more double bonds, $L^1$ and $L^2$ are linear or branched divalent groups which may be identical or different, x' is an integer ranging from 1 to 10, preferably from 1 to 5, better still equal to 2, y' and z' are integers such that y'+z'=2x', x is an integer ranging from 1 to 20, preferably from 1 to 15, better still from 2 to 8, y and z are integers such that y+z=2x, m is equal to 0 or 1, preferably 0, p' is equal to 0 or 1, preferably 0, and p'' is equal to 0 or 1, preferably 0. R''' can also denote an aliphatic or aromatic acyl group, in particular the acetyl or trifluoroacetyl group.

The R''' group is preferably a fluoroalkyl, better still perfluoroalkyl, group which is linear or branched. It preferably comprises from 1 to 10 carbon atoms, better still from 1 to 5 and ideally from 1 to 3 carbon atoms and represents in particular the trifluoromethyl group.

The group of formula $(C_xH_yF_z)$ is preferably a group of formula $(CF_2)_x$, wherein x is as defined previously. The group of formula $(C_xH_yF_z)$ is preferably a group of formula $(CH_2)$ x', wherein x' is as defined previously.

The $L^1$ and $L^2$ groups, when they are present, can be chosen from the divalent groups L, L' and L'' previously mentioned and can also represent oxyalkylene (—O-alkylene-) or alkyleneoxy (-alkylene-O—) groups which are preferably $C_2$-$C_4$ groups, better still $C_2$-$C_3$ groups. The $—(L^2)_p$-R''' group is preferably a fluoroalkyl or perfluoroalkyl group, ideally a trifluoromethyl group.

In one embodiment, the fluoroalkyl group of compound C is a group of formula (I) in which m=p'=p''=z'=0, R'''=perfluoroalkyl.

Examples of fluoroalkyl groups of formula (I) are the groups of formulae:

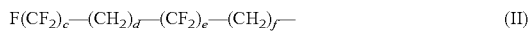

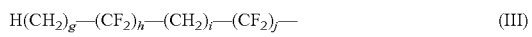

wherein each of c, d, e, f, g, h, i and j denote an integer ranging from 0 to 10, at least one of c, d, e and f is other than 0, at least one of g, h, i and j is other than 0. Preferably, 2≤c+d+e+f≤12 and/or 2≤g+h+i+j≤12, and better still 3≤c+d+e+f≤8 and/or 3≤g+h+i+j≤8.

The preferred group of formula (I) is a (perfluoroalkyl) alkyl group such as the 3,3,3-trifluoropropyl group.

The precursor compound of the layer A preferably contains at least one silicon atom bearing at least one alkyl group, preferably a C1-C4 alkyl group, better still at least one silicon atom bearing one alkyl group, preferably a C1-C4 alkyl group, and a fluoroalkyl group directly bonded to the silicon atom (through a carbon atom). The preferred alkyl group is the methyl group. The vinyl group may also be used instead of an alkyl group. Preferably, the compound C comprises at least one C—Si—C group and better still the silicon atom of the group Si-fluoroalkyl is directly bonded to at least one (other) carbon atom.

Preferably, each silicon atom of the compound C is not directly bonded to more than two fluoroalkyl groups, better still is not directly bonded to more than one fluoroalkyl group, and better still, each silicon atom of the compound C is directly bonded to a single fluoroalkyl group. Preferably, the compound C has an Si/O atomic ratio equal to 1. Preferably, the compound C has a C/Si atomic ratio >2, more preferably >3. Again preferably, the compound C has a C/O atomic ratio >2, more preferably >3. According to one embodiment, the compound C does not comprise an Si—N group and better still does not comprise any nitrogen atoms.

The silicon atom or atoms of the precursor compound of the layer A are preferably only bonded to alkyl groups, fluoroalkyl groups, hydrogen and/or groups containing an —O—Si or —NH—Si chain so as to form an Si—O—Si or Si—NH—Si group. In one embodiment, the compound C contains at least one Si—O—Si-fluoroalkyl group or at least one Si—NH—Si-fluoroalkyl group.

The precursor compounds of the layer A preferably contain an Si—O—Si group and more preferably a group of formula:

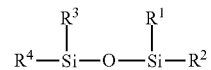

where $R^1$ to $R^4$ independently designate alkyl, vinyl, aryl, hydroxyl or hydrolyzable groups, and at least one of $R^1$ to $R^4$ designates a fluoroalkyl group. The alkyl group is preferably a C1-C4 alkyl group (for example the methyl group). The vinyl group is preferably a C2-C4 vinyl group.

Examples of hydrolyzable groups are: H, the acyloxy groups having the formula —O—C(O) $R^4$ where $R^4$ is a preferably C6-C12 aryl group optionally substituted with one or more functional groups, or a linear or branched and preferably C1-C6 alkyl group optionally substituted with one or more functional groups and possibly furthermore comprising one or more double bonds, such as the phenyl, methyl or ethyl groups; the aryloxy and alkoxy groups having the formula —O—$R^5$ where $R^5$ is a preferably C6-C12 aryl group optionally substituted with one or more functional groups, or a linear or branched and preferably C1-C6 alkyl group optionally substituted with one or more functional groups and possibly furthermore comprising one or more double bonds, such as the phenyl, methyl or ethyl groups; the halogens are preferably F, Cl, Br or I; the groups of formula —NR$^1$R$^2$ may designate an amino group NH$_2$ or an alkylamino, arylamino, dialkylamino or diarylamino group; $R^1$ and $R^2$ independently designate a hydrogen atom, a preferably C6-C12 aryl group optionally substituted with one or more functional groups, or a linear or branched and preferably C1-C6 alkyl group optionally substituted with one or more functional groups and possibly furthermore comprising one or more double bonds, such as the phenyl, methyl or ethyl groups; and the groups of formula —N(R$^3$)—Si, attached to the silicon atom by way of their nitrogen atom, and their silicon atom naturally comprises three other substituents, where $R^3$ designates a preferably C6-C12 aryl group optionally substituted with one or more functional groups, or a linear or branched and preferably C1-C6 alkyl group optionally substituted with one or more functional groups and possibly furthermore comprising one or more double bonds, such as the phenyl, methyl or ethyl groups.

The preferred acyloxy group is the acetoxy group. The preferred aryloxy group is the phenoxy group. The preferred halogen is Cl. The preferred alkoxy groups are the methoxy and ethoxy groups.

In one embodiment, the silicon atom or atoms of compound C are not bound to any hydrolyzable or hydroxyl group. Groups containing an Si—O—Si chain are not considered as being "hydrolyzable groups" in the context of the invention.

According to one preferred embodiment, the compound C is a cyclic polysiloxane of formula:

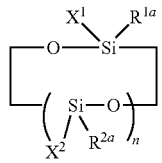

where the $X^1$ and $X^2$ groups represent independently an alkyl, a vinyl, an aryl, a hydroxyl or a hydrolyzable group (which have been described hereabove), n designates an integer ranging from 2 to 20 and preferably from 3 to 8, and the $R^{1a}$ and $R^{2a}$ groups represent independently a fluoroalkyl group. Non limiting examples of hydrolyzable groups for $X^1$ and $X^2$ are the chloro, bromo, alkoxy, acyloxy, aryloxy and H groups.

The most common members belonging to this group are the tetrakis(fluoroalkyl) tetraalkyl cyclotetrasiloxanes, the pentakis (fluoroalkyl) triaalkyl cyclotetrasiloxanes, the hexakis (fluoroalkyl) dialkyl cyclotetrasiloxanes, the tris (fluoroalkyl) pentaalkyl cyclotetrasiloxanes, the bis(fluoroalkyl) hexaalkyl cyclotetrasiloxanes, the tris(fluoroalkyl) trialkyl cyclotrisiloxanes, the tetrakis(fluoroalkyl) dialkyl cyclotrisiloxanes, the pentakis (fluoroalkyl) alkyl cyclotrisiloxanes, the hexakis (fluoroalkyl) cyclotrisiloxanes, the bis (fluoroalkyl) tetraalkyl cyclotrisiloxanes, the (fluoroalkyl) pentaalkyl cyclotrisiloxanes, preferably those compound wherein the alkyl groups are methyl groups, 1,3,5-tris(3,3, 3-trifluoropropyl)-1,3,5-trimethylcyclotrisiloxane (FCTS of formula (IV) shown below) being the preferred compound:

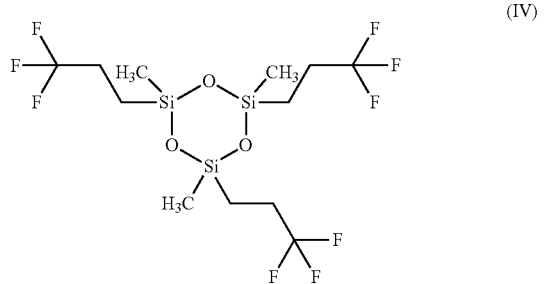 [SMILES: C[Si]1(CCC(F)(F)F)O[Si](C)(CCC(F)(F)F)O[Si](C)(CCC(F)(F)F)O1]

(IV)

Other examples of compounds C are 2,2,4,4,6,6,8-heptamethyl-8-(3,3,3-trifluoropropyl)-cyclotetrasiloxane, 2,4,6,8-tetramethyl-2,4,6,8-tetrakis(3,3,3-trifluoropropyl)-cyclotetrasiloxane, 2,4,6,8,10-pentamethyl-2,4,6,8,10-pentakis(3, 3,3-trifluoropropyl)-cyclopentasiloxane.

In certain cases, the layer A is obtained from a mixture of a certain number of compounds, wherein the integer n may vary within the limits indicated above.

According to another embodiment, the compound C is a linear alkyl fluoroalkyl siloxane, better still a linear methyl fluoroalkyl siloxane such as for example 1,3-dimethyl-1,3-bis(3,3,3-trifluoropropyl) disiloxane-1,3-diol, 1,3,5-trimethyl-1,3,5-tris(3,3,3-trifluoropropyl) trisiloxane-1,5-diol, 1,1,1,3,5,7,7,7-octamethyl-3,5-bis(3,3,3-trifluoropropyl) tetrasiloxane, 1,1,3,3-tetramethoxy-1,3-bis(3,3,3-trifluoropropyl)-disiloxane.

In one embodiment, layer A is formed in absence of organosilicon compounds that do not contain any fluoroalkyl group. In another embodiment, layer A is not formed from organic compounds that do not contain silicon. In further embodiments, layer A is not formed from organic compounds that neither contain silicon nor fluoroalkyl group, or is not formed from organic compounds that are not compounds C according to the invention.

In one embodiment, layer A is not formed from organosilicon compounds that do not contain any fluoroalkyl group. In another embodiment, layer A is not formed from organic compounds that do not contain silicon. In further embodiments, layer A is not formed from organic compounds that neither contain silicon nor fluoroalkyl group, or is not formed from organic compounds that are not compounds C according to the invention.

The precursor compound of the layer A is preferably introduced into the vacuum chamber in which articles according to the invention are produced in gaseous form, while controlling its flow rate. In other words, it is preferably not vaporized inside the vacuum chamber. The feed of the precursor compound of the layer A is preferably located a distance away from the exit of the ion gun which is ranging from 30 to 50 cm.

In an embodiment, the layer A is not formed from inorganic (mineral) precursor compounds and, in particular, it is not formed from precursors having a metal oxide nature.

In that case, the process allowing the antireflection coating according to the invention to be formed is therefore much simpler than processes in which an organic compound and an inorganic compound are co-evaporated.

Since the layer A is formed by vacuum deposition, it does not contain any silane hydrolysate and therefore differs from sol-gel coatings obtained by liquid processing. The layer A preferably has a thickness ranging from 20 to 150 nm and more preferably from 25 to 120 nm. When it forms the external layer of a multilayer antireflection coating, the layer A preferably has a thickness ranging from 60 to 100 nm.

The extinction coefficient (also known as attenuation coefficient) of a particular substance, denoted k, measures the loss in energy of electromagnetic radiation traversing this medium. This is the imaginary part of the complex refractive index. Preferably, the layers A according to the invention have an extinction coefficient k at 550 of less than or equal to $10^{-3}$, preferably less than or equal to $10^{-4}$, more preferably less than or equal to $5\times10^{-5}$.

The mechanical properties of the layer A have been evaluated through nano-indentation measurements. To this end, the modulus of elasticity E of the material forming the layer A and its hardness H have been measured by an instrument-controlled penetration test (indentation), according to a method described in detail in the experimental part. If need be, reference will be made to the standard NF EN ISO 14577. The hardness H characterizes the ability of the material to withstand a permanent indentation or a deformation when it is brought in contact with an indenter under a compression load. The modulus of elasticity E (or Young's modulus, or storage modulus, or tensile modulus of elasticity) makes it possible to evaluate the ability of the material to deform under the effect of a force applied.

The layer A according to the invention preferably exhibits a hardness H≥5 GPa, preferably ≥5.5 GPa, more preferably ≥6 GPa.

The layer A according to the invention preferably exhibits a ratio H/E higher than or equal to 0.10; 0.11; 0.12; 0.13; 0.14; 0.15; 0.16 (the higher is better), H and E being expressed with the same unit, typically GPa.

Without being linked by a theory, it is thought that the H/E ratio expresses the fracture resistance (resistance to the propagation of the crack). The layer and the articles according to the invention are durable as they exhibit a good fracture resistance.

The modulus of elasticity E of the material forming the layer A preferably varies from 30 to 80 GPa, more preferably from 40 to 60 GPa.

The critical temperature, as defined hereafter, of a coated article according to the invention is preferably higher than or equal to 80° C. In the present application, the critical temperature of an article or a coating is defined as being the temperature from which cracks are observed to appear in the stack present on the surface of the substrate, this resulting in degradation of the coating. This high critical temperature is due to the presence of the layer A on the surface of the article, as demonstrated in the experimental section.

In some applications, it is preferable for the main surface of the substrate to be coated with one or more functional coatings prior to the deposition of the layer A or the multilayer coating comprising layer A. These functional coatings, which are conventionally used in optics, may, without limitation, be a primer layer for improving the shock-resistance and/or adhesion of subsequent layers in the final product, an anti-abrasion and/or anti-scratch coating, a polarized coating, a photochromic coating or a tinted coating, and may in particular be a primer layer coated with an anti-abrasion and/or anti-scratch layer. The latter two coatings are described in greater detail in the patent applications WO 2008/015364 and WO 2010/109154.

The article according to the invention may also comprise coatings, formed on the antireflection coating, capable of modifying the surface properties of the antireflection coating, such as a hydrophobic and/or oleophobic coating (anti-fouling top coat) or an anti-fogging coating. These coatings are preferably deposited on the external layer of the antireflection coating. They are generally lower than or equal to 10 nm in thickness, preferably from 1 to 10 nm in thickness and more preferably from 1 to 5 nm in thickness. They are described in patent applications WO 2009/047426 and WO 2011/080472, respectively.

Typically, an article according to the invention comprises a substrate successively coated with an adhesion and/or anti-shock primer layer, an anti-abrasion and/or anti-scratch coating, an optionally antistatic antireflection coating according to the invention and containing a layer A generally as an external layer, and a hydrophobic and/or oleophobic coating.

Preferably the article according to the invention is an optical lens, more preferably an ophthalmic lens.

The invention also relates to a process for manufacturing an optical article as claimed in any one of the preceding claims, comprising at least the following steps:

providing an optical article comprising a substrate having a front main face and a rear main face, depositing onto the rear main face of the substrate a multilayer antireflection coating, the outermost layer of which is a layer A containing silicon, carbon and fluorine, said layer A having a refractive index lower than or equal to 1.45 and a thickness higher than or equal to 20 nm, recovering an optical article comprising a substrate having a rear main face coated with a multilayer antireflection coating, the outermost layer of which being said layer A, and a front main face, the mean light reflection factor Rv on said rear main face between 380 nm and 780 nm is lower than or equal to 1.5%, the mean reflection factor Ruv on said rear main face between 280 nm and 380 nm, weighted by the function W(λ) defined in the ISO 13666:1998 standard, is lower than or equal to 7%, for an angle of incidence of 35°.

The following examples illustrate the present invention in a more detailed, but non-limiting manner. The invention is illustrated in a nonlimiting way by the following examples. Unless otherwise indicated, refractive indices are given for a wavelength of 550 nm and T=20-25° C.

EXAMPLES

1. General Procedures

In example 2, the substrate is a 65 mm-diameter polythiourethane MR8® lens substrate (from Mitsui Toatsu Chemicals Inc., refractive index=1.59), with a power of −2.00 diopters and a thickness of 2.0 mm, coated on its concave face with an impact resistant primer polyurethane coating having a refractive index of 1.6 and applied over it an the abrasion- and scratch-resistant coating (hard coat) (having a refractive index of 1.6), and an antireflection coating having a layer A according to the invention as an outermost layer.

In example 1 and comparative example CE1, the substrate is an ORMA® lens substrate (polymer obtained by polymerization of diethylene glycol bis(allyl carbonate) from Essilor based on CR-39® monomer, refractive index=1.5) having a thickness of 2.0 mm, coated on its concave face with an impact resistant primer coating based on a W234™ polyurethane material disclosed in the experimental part of WO 2010/109154, and applied over it the abrasion- and scratch-resistant coating (hard coat) disclosed in example 3 of EP 0614957 (having a refractive index of 1.48) and an antireflection coating having a layer A according to the invention as an outermost layer.

The vacuum deposition reactor suitable for the deposition is a box coater (Boxer Pro, Leybold Optics) machine equipped with an electron beam source (HPE-6) that can be used for the evaporation of the precursor materials, with a thermal evaporator, with an end Hall ion source (ion gun) eH-1000 (from Kaufman & Robinson Inc.) for use in the preliminary phase of (IPC) preparation of the surface of the substrate by argon ion bombardment and in the ion-assisted deposition (IAD) of the layer A or of other layers, and with a system for introducing liquid, which system is used when the precursor compound of the layer A is a liquid under the operation conditions (the case of the compound of formula (IV)). This system comprises a reservoir containing the liquid precursor compound of the layer A, resistive heaters for heating the reservoir (generally at 120° C.), tubes connecting the reservoir of liquid precursor to the vacuum deposition machine, and a vapor flowmeter from MKS (MKS1150C), raised to a temperature of 30-150° C. during its use, depending on the flow rate of the vaporized precursor, which preferably can vary from 1 to 50 sccm, preferably from 1 to 30 sccm, more preferably from 1 to 20 sccm, even better from 1 to 10 and optimally 2 to 10 sccm. The precursor vapor exits from a tube inside the machine, at a distance of about 30 cm from the ion gun. Flows of oxygen and optionally of argon are introduced into the ion gun. Preferably, neither argon nor any other noble gas is introduced into the ion gun.

The layers A according to the invention can be formed by vacuum evaporation under oxygen ion bombardment of the compound of formula (IV) [CAS no 2374-14-3], without heating the substrate.

The thickness of the deposited layers can be controlled in real time by means of a quartz microbalance. Unless otherwise indicated, the thicknesses mentioned are physical thicknesses.

2. Operating Modes

The method used to produce optical articles according to the invention comprised introducing the substrate into the vacuum deposition chamber; a step of preheating the vaporizer, tubes and the vapor flowmeter to the chosen temperature (~20 min); a primary pumping step; then a secondary pumping step lasting 400 seconds and allowing a secondary vacuum to be obtained (~2×10$^{-5}$ mbar, pressure read from a Bayard-Alpert gauge); a step of activating the surface of the substrate with a beam of argon ions (IPC: 1 minute, 100 V, 1 A, the ion gun being stopped at the end of this step); and then successively evaporating the required number of layers (optional intermediate optical impedance layers, optional sub-layer, and antireflection coating layers including layer A) at a rate ranging from 0.05 to 3 nm/s, and lastly a ventilation step. Layer A was deposited by evaporation assisted by a beam of oxygen.

Suitable deposition conditions of a representative optical article (example 2) are as follows: a deposition step of an SiO$_2$ optical (impedance) layer at a rate of 1 nm/s under an O$_2$ pressure of 8.10-5 mBar, a deposition step of a thin ZrO$_2$ optical (impedance) layer at a rate of 1 nm/s under an O$_2$ pressure of 6.105 mBar, a surface activation step using an argon ion beam for 30 seconds (same treatment as IPC already conducted directly on the substrate), a deposition step of a SiO$_2$ sub-layer at a rate of 3 nm/s under an O$_2$ atmosphere at a pressure of 1.3×10$^{-4}$ mBar, a surface activation step of the sub-layer using an argon ion beam for 30 seconds (same treatment as IPC already conducted directly on the substrate), stopping the ionic irradiation, a deposition step of a HI layer (ZrO$_2$) at a rate of 2 nm/s under an O$_2$ pressure of 6.105 mBar, a deposition step of a LI layer (SiO$_2$) at a rate of 2 nm/s, a deposition step of a HI layer (ZrO$_2$) at a rate of 2 nm/s under an O$_2$ pressure of 6.10-5 mBar, a deposition step of an SnO$_2$ layer (HI, electrically conductive) at a rate of 1 nm/s with an oxygen ion assistance (ion gun: 2 A, 100 V), and a deposition step of a layer A according to the invention at a rate of 0.1 nm/s.

Suitable deposition conditions of layer A are the following:
the ion gun is started with argon, oxygen is added in the ion gun with a set flow rate (15 sccm), the flow of argon is cut, the desired anode current (3 A) is input and the compound of formula (IV, "FCTS") is introduced into the chamber (flow rate set to 3.5 sccm). The precursor compound supply is stopped once the desired thickness is obtained, then the ion gun is turned off.

3. Characterizations

Colorimetric measurements (in reflection) of the face coated with the interferential coating of the invention (concave face): reflection factors Rv and Ruv, hue angle h and chroma C* in the international colorimetric CIE (L*, a*, b*) space were carried out with a Zeiss spectrophotometer, taking into account the standard illuminant D65, and the standard observer 10° (for h and C*). They are provided for an angle of incidence of 15°.

The robustness of various parameters was calculated as follows with the Essential Mac Leod software provided by Thin Film Center. A simulation was made so as to test the robustness (also called standard deviation or Std Dev) of the multilayered antireflective coatings 1 and 2 according to the invention and of comparative example CE1. Hence 500 iterations were made so as to evaluate the impact of the thickness variations (one standard deviation corresponds to ±2.2% variation in normal/gaussian distribution for the thickness of each layer of the stack, all varied independently and at the same time) induced by the manufacturing process which may affect the performances and properties of two different lens comprising the same structure (same composition and thickness layers), such as chroma C* (in reflection) and the optical factors: Rv, Ruv for an angle of incidence of 15° (illuminant D65 and observer) 10°. The "average" values given in the tables of the following paragraphs are the average values of the parameters on 500 samples obtained after applying a ±2.2% random variation to the thickness of each layer of the stack. The standard deviation quantifies the amount of variation or dispersion of the set of data values. A low standard deviation indicates that the data points tend to be close to the average of the parameter.

4. Results

The tables below indicate for each of the examples and comparative examples the results of the tests to which the articles were subjected. The sub-layer line is gray-colored

| Example 1 Substrate + primer/hard coat | |
|---|---|
| ZrO$_2$ (b) | 16 nm |
| SiO$_2$ | 24 nm |
| ZrO$_2$ (b) | 101 nm |
| SnO$_2$ (c) | 6.5 nm |
| Layer A Compound (IV)** (c) | 81 nm |
| Rv (%) | 0.27 |
| Average Rv (%) | 0.28 |
| Std Dev Rv (%) | 0.06 |
| h | 158 |
| C* | 0.6 |
| Average C* | 1.8 |
| Std Dev C* | 1 |
| Ruv (%) | 2.71 |
| Average Ruv (%) | 2.76 |
| Std Dev Ruv (%) | 0.45 |

| Comparative example CE1 Substrate + primer/hard coat | |
|---|---|
| ZrO$_2$ (b) | 14 nm |
| SiO$_2$ | 29 nm |
| ZrO$_2$ (b) | 102 nm |
| SnO$_2$ (c) | 6.5 nm |
| SiO$_2$ | 77 nm |
| Rv (%) | 0.41 |
| Average Rv (%) | 0.42 |
| Std Dev Rv (%) | 0.06 |
| h | 282 |
| C* | 3.9 |
| Average C* | 4.2 |
| Std Dev C* | 1.6 |
| Ruv (%) | 2.15 |
| Average Ruv (%) | 2.28 |
| Std Dev Ruv (%) | 0.46 |

-continued

Example 2
Substrate + primer/hard coat

| | |
|---|---|
| SiO$_2$ | 56 nm |
| ZrO$_2$ (a, b) | 5 nm |
| SiO$_2$ (a, b) | 290 nm |
| ZrO$_2$ (b) | 15 nm |
| SiO$_2$ | 28 nm |
| ZrO$_2$ (b) | 107 nm |
| SnO$_2$ (c) | 6.5 nm |
| Layer A Compound (IV)** (c) | 77 nm |
| Rv (%) | 0.43 |
| Average Rv (%) | 0.46 |
| Std Dev Rv (%) | 0.09 |
| h | 108 |
| C* | 1.0 |
| Average C* | 1.7 |
| Std Dev C* | 0.9 |
| Ruv (%) | 2.76 |
| Average Ruv (%) | 2.78 |
| Std Dev Ruv (%) | 0.65 |

**Refractive index: 1.43.
Ruv is measured at an incidence of 35°.
(a) Ionic bombardment treatment of the layer surface before depositing the next layer.
(b) Oxygen supply during deposition.
(c) Ion assisted deposition (IAD).

The examples according to the invention exhibits the best combination of properties, i.e., a low chroma value C* (lower than or equal to 1, compared to 3.9 for comparative example CE1, associated with a high robustness (standard deviation of 1 and 0.9 for Examples 1 and 2) while exhibiting at the same time low light reflection factor in the visible range Rv and low mean reflection factor Ruv (Ruv lower than 2.8%).

It is particularly remarkable to obtain a standard deviation of 1 or lower for a low chroma value as the man skilled in the art knows that the robustness generally decreases when the chroma value is decreasing.

The invention claimed is:

1. An optical article comprising a substrate having a front main face and a rear main face, the rear main face being coated with a multilayer antireflection coating, wherein the outermost layer of said multilayer antireflection coating is a layer A containing silicon, carbon and fluorine atoms, said layer A having a refractive index lower than or equal to 1.45 and a thickness higher than or equal to 20 nm, said layer A having been formed from one or more precursors excluding inorganic precursor compounds, and
the mean light reflection factor Rv on said rear main face between 380 nm and 780 nm is lower than or equal to 1.5%,
the mean reflection factor Ruv on said rear main face between 280 nm and 380 nm, weighted by the function W(λ) defined in the ISO 13666:1998 standard, is lower than or equal to 7%, for an angle of incidence of 35°.

2. The article as claimed in claim 1, wherein layer A has a refractive index ranging from 1.40 to 1.45.

3. The article as claimed in claim 2, wherein the layer A has a refractive index ranging from 1.42 to 1.45.

4. The article as claimed in claim 1, wherein the multilayer antireflection coating has a chroma C* as defined in the international colorimetric system CIE L*a*b* lower than or equal to 3, for an angle of incidence of 15°.

5. The article as claimed in claim 1, wherein said multilayer antireflection coating has a chroma C* whose standard deviation is lower than 1.4.

6. The article as claimed in claim 1, wherein said multilayer antireflection coating has a hue angle h ranging from 255° to 285°.

7. The article as claimed in claim 1, wherein said multilayer antireflection coating has a hue angle h ranging from 120° to 175°.

8. The article as claimed in claim 1, wherein layer A has a thickness ranging from 20 to 150 nm.

9. The article as claimed in claim 1, comprising a hydrophobic and/or oleophobic coating applied onto layer A.

10. The article as claimed in claim 1, further defined as an optical lens.

11. The article as claimed in claim 1, further defined as an ophthalmic lens.

12. A process for manufacturing an optical article as claimed in claim 1, comprising at least the following steps:
providing an optical article comprising a substrate having a front main face and a rear main face,
depositing onto the rear main face of the substrate a multilayer antireflection coating, the outermost layer of which is a layer A containing silicon, carbon and fluorine, said layer A having a refractive index lower than or equal to 1.45 and a thickness higher than or equal to 20 nm,
recovering an optical article comprising a substrate a multilayer having a rear main face coated with antireflection coating, the outermost layer of which being said layer A, and a front main face,
the mean light reflection factor Rv on said rear main face between 380 nm and 780 nm is lower than or equal to 1.5%,
the mean reflection factor Ruv on said rear main face between 280 nm and 380 nm, weighted by the function W(λ) defined in the ISO 13666:1998 standard, is lower than or equal to 7%, for an angle of incidence of 35°.

13. The article as claimed in claim 2, wherein the layer A has a refractive index ranging from 1.43 to 1.45.

14. The article of claim 4, wherein the multilayer antireflection coating has a chroma C* as defined in the international colorimetric system CIE L*a*b* lower than or equal to 2, for an angle of incidence of 15°.

15. The article as claimed in claim 1, wherein layer A has a thickness ranging from 25 to 120 nm.

16. The article as claimed in claim 1, wherein layer A is formed from at least one fluorinated organosilicon compound.

17. The article as claimed in claim 1, wherein layer A is formed by depositing, under an ion beam, activated species issued from at least one organic compound C in gaseous form.

18. The article as claimed in claim 17, wherein compound C contains in its structure at least one Si—R group, where R is a fluoroalkyl group, at least one carbon atom, and at least one hydrogen atom.

19. The article as claimed in claim 17, wherein compound C is a cyclic polysiloxane of formula:

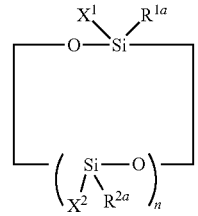

where the $X^1$ and $X^2$ groups represent independently an alkyl, a vinyl, an aryl, a hydroxyl or a hydrolyzable group, n designates an integer ranging from 2 to 20 and preferably from 3 to 8, and the $R^{1a}$ and $R^{2a}$ groups represent independently a fluoroalkyl group.

20. The article as claimed in claim 17, wherein compound C is selected from the group consisting of tetrakis(fluoroalkyl) tetraalkyl cyclotetrasiloxanes, pentakis (fluoroalkyl) triaalkyl cyclotetrasiloxanes, hexakis (fluoroalkyl) dialkyl cyclotetrasiloxanes, tris(fluoroalkyl) pentaalkyl cyclotetrasiloxanes, bis(fluoroalkyl) hexaalkyl cyclotetrasiloxanes, tris (fluoroalkyl) trialkyl cyclotrisiloxanes, tetrakis(fluoroalkyl) dialkyl cyclotrisiloxanes, pentakis (fluoroalkyl) alkyl cyclotrisiloxanes, hexakis (fluoroalkyl) cyclotrisiloxanes, bis (fluoroalkyl) tetraalkyl cyclotrisiloxanes, (fluoroalkyl) pentaalkyl cyclotrisiloxanes, and 1,3,5-tris(3,3,3-trifluoropropyl)-1,3,5-trimethylcyclotrisiloxane.

\* \* \* \* \*